United States Patent
Conley, Jr. et al.

(10) Patent No.: US 6,930,059 B2
(45) Date of Patent: *Aug. 16, 2005

(54) METHOD FOR DEPOSITING A NANOLAMINATE FILM BY ATOMIC LAYER DEPOSITION

(75) Inventors: John F. Conley, Jr., Camas, WA (US); Yoshi Ono, Camas, WA (US); Rajendra Solanki, Portland, OR (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/376,794

(22) Filed: Feb. 27, 2003

(65) Prior Publication Data

US 2004/0171280 A1 Sep. 2, 2004

(51) Int. Cl.[7] .................. H01L 21/31; H01L 21/469
(52) U.S. Cl. ...................... 438/785; 427/126.4
(58) Field of Search ................. 117/89; 438/785; 427/97.1, 126.4, 126.6

(56) References Cited

U.S. PATENT DOCUMENTS

| | | | |
|---|---|---|---|
| 6,060,755 A | * | 5/2000 | Ma et al. ............. 257/410 |
| 6,121,068 A | * | 9/2000 | Ramdani et al. ........ 438/39 |
| 6,203,613 B1 | | 3/2001 | Gates et al. |
| 6,348,386 B1 | | 2/2002 | Gilmer |
| 6,420,279 B1 | | 7/2002 | Ono et al. |
| 6,486,080 B2 | | 11/2002 | Chooi et al. |
| 6,697,194 B2 | * | 2/2004 | Kuschnereit et al. ....... 359/359 |

OTHER PUBLICATIONS

J.F. Conley, Jr., Y. Ono, W. Zhuang, D.J. Tweet, W. Gao, S.K. Mohammed, R. Solanki, Atomic Layer Deposition of Hafnium Oxide Using Anhydrous Hafnium Nitrate. Electrochemical and Solid–State Letters. 5 (5) C57–C59 (2002).
H. Zhang, R. Solanki, B. Roberds, G. Bai, I. Banerjee, High permittivity thin film nanolaminates, Journal of Applied Physics, vol. 87, No. 4, Feb. 15, 2000, pp. 1921–1924.
Y. Ma, Y. Ono, L. Stecker, D.R. Evans, S.T. Hsu, Zirconium Oxide Based Gate Dielectrics with Equivalent Oxide Thickness of Less Than 1.0nm and Performance of Submicron MOSFET using a Nitride Gate Replacement Process. IEDM 99. pp. 149–152.

* cited by examiner

Primary Examiner—George Fourson
Assistant Examiner—Fernando L. Toledo
(74) Attorney, Agent, or Firm—David C. Ripma; Joseph P. Curtin (57) ABSTRACT

An atomic layer deposition method to deposit an oxide nanolaminate thin film is provided. The method employs a nitrate ligand in a first precursor as an oxidizer for a second precursor to form the oxide nanolaminates. Using a hafnium nitrate precursor and an aluminum precursor, the method is well suited for the deposition of a high k hafnium oxide/aluminum oxide nanolaminate dielectric for gate dielectric or capacitor dielectric applications on a hydrogen-terminated silicon surface.

9 Claims, 5 Drawing Sheets

METHOD FOR DEPOSITING A NANOLAMINATE FILM BY ATOMIC LAYER DEPOSITION

CROSS-REFERENCE TO RELATED PATENT APPLICATION

The present application is related to application Ser. No. 10/376,774, entitled "Atomic layer of deposition of oxide film," invented by the inventors of the present invention and filed Feb. 27, 2003.

FIELD OF THE INVENTION

The present invention relates to an atomic layer deposition (ALD) method to deposit a metal oxide nanolaminate film by using a metal nitrate-containing precursor as an oxidizing agent for another metal-containing precursor. The invention may be used in numerous applications, including electro-optic structures, optical coating, and passivation coating for metallurgical and biomedical applications. Particularly, the present invention relates to integrated circuit fabrication, and specifically to a gate dielectric for a semiconductor transistor and a capacitor dielectric for a memory circuit.

BACKGROUND OF THE INVENTION

Dielectric materials in semiconductor devices in integrated circuits appear as gate dielectrics in field effect transistors (FET) and capacitor dielectric in dynamic random access memory (DRAM). The dimensions of these dielectrics are related directly to the performance of the semiconductor devices. To achieve faster responses and more complex functionalities, today's generations of integrated circuits become smaller and smaller in all directions, lateral sizes as well as thickness.

The performance of a dynamic random access memory (DRAM) device is related to the charge stored in its capacitor, which is directly proportional to its area and dielectric constant k and inversely proportional to its thickness. As the sizes decrease, to maintain adequate capacitance charges for a high performance DRAM device, a high k dielectric is highly desirable for a capacitor dielectric.

The speed of a semiconductor device is directly proportional to the response of a gate dielectric in a field effect transistor (FET) after a voltage is applied. The response of a gate dielectric is directly proportional to its dielectric constant k and inversely proportional to its thickness t. Thus, the need for a thin and high k dielectric is also highly desirable for a gate dielectric.

The primary material for gate dielectrics is silicon dioxide ($SiO_2$) with a dielectric constant of about 4. As the device dimensions continue to be scaled down, the thickness of the silicon dioxide gate dielectric has reached the tunneling limit of 1.5–2 nm. Silicon dioxide films of less than 1.5 nm generally cannot be used as a gate dielectric in FET devices mainly because of the excessive power consumption due to the high leakage from the direct tunneling currents. There are also other fabrication and reliability concerns for such a very thin silicon dioxide film such as boron penetration, and charge injection damage.

Many high dielectric constant dielectric materials (high k dielectric) have been investigated as possible replacements for silicon dioxide but a suitable replacement has still not been found because of the many other stringent requirements such as low leakage current, formation of a good interface with silicon substrate, low thermal budget for the fabrication process, and device high channel mobility. Potential candidates include titanium oxide ($TiO_2$), tantalum oxide ($Ta_2O_5$, k value between 9 and 27), aluminum oxide ($Al_2O_3$, k value about 9), zirconium oxide ($ZrO_2$, k value between 10 and 25), hafnium oxide ($HfO_2$, k value between 10 and 25), and various combinations and mixtures such as multilayers, multicomponents, and nanolaminates.

The current leading candidates for high k dielectric materials for gate dielectric applications are zirconium oxide and hafnium oxide. The bulk dielectric constant of these materials is about 20 to 25, meaning a thickness of about 5 to 6 nm of these materials is equivalent to a thickness of 1 nm of silicon dioxide.

Zirconium oxide films deposited via ALD show good insulating properties including high dielectric constant and low leakage. A major concern, however, is that it does not deposit directly on a hydrogen-terminated surface smoothly, but instead requires a thin layer of silicon dioxide for uniform initiation. For example, see Conley et al, "*Atomic layer deposition of hafnium oxide using anhydrous hafnium nitrate*", Electrochemical and Solid-State Letters, 5 (5), C57,59 (2002) and the references cited therein. The presence of the thin silicon dioxide interfacial layer is not desirable because it is then very difficult to achieve a silicon dioxide equivalent thickness of 1nm. The hydrogen-terminated silicon surface is a silicon surface free of any native silicon oxide and the dangling bonds of silicon are terminated with hydrogen. The hydrogen-terminated silicon surface is the result of standard industry semiconductor cleaning processes. These standard cleaning processes are typically quick immersions of the silicon wafers into an HF solution to produce silicon surfaces that are hydrogen terminated, also known as hydrogen passivation.

Research on hafnium oxide indicates that smooth, uniform and amorphous hafnium oxide films can be deposited directly on hydrogen-terminated silicon surfaces under proper deposition conditions. A dielectric constant of 10.5 and a capacitance equivalent thickness of 2.1 nm have been achieved with a 5.7 nm thick hafnium oxide deposited directly on hydrogen-terminated silicon surface. This is a very desirable feature because it indicates that further research could further reduce the equivalent thickness to 1 nm or below. However, the deposited hafnium oxide films still suffer from various problems. One problem is its low crystallization temperature, resulting in a much lower thermal budget for the fabrication process of the semiconductor devices. Another problem is that the quality of the interface of hafnium oxide and silicon substrate is relatively poor with respect to silicon dioxide/silicon interface and that results in low channel mobility when integrated into semiconductor device structures.

It has been shown that thin alternating layers of insulators can produce a composite film (or nanolaminate) whose properties can be adjusted. Previous research of Zhang et al., "*High permittivity thin film nanolaminates*", Journal of Applied Physics, Vol. 87, No 4, 15 Feb. 2000, indicated that nanolaminates of $Ta_2O_5$—$HfO_2$, $ZrO_2$—$HfO_2$, and $Ta_2O_5$—$ZrO_2$ show different properties depending on the thickness of the nanolaminates.

Previous research also indicated that the properties of the high k dielectric films could be modified with the doping of aluminum. For example, Ma et al., U.S. Pat. No. 6,060,756, "*Aluminum-doped zirconium dielectric film transistor structure and deposition method for same*," the content being incorporated herein by reference, discloses that the doping of a high dielectric constant material such as zirconium oxide with a trivalent metal such as aluminum increases the crystallized temperature so that the resulting film remains amorphous under high temperature processing conditions. Zirconium oxide films doped with aluminum produce an amorphous film with better uniformity, but with slightly lower dielectric constant.

From the process side, one of the basic deposition processes of modern semiconductor device structures is Chemical Vapor Deposition (CVD). In CVD, a combination of precursor gases or vapors flows over the wafer surface at an elevated temperature. Reactions then take place at the hot surface where deposition occurs. The temperature of the wafer surface is an important factor in CVD deposition, as it affects the deposition reactions of the precursors and also the uniformity of deposition over the large wafer surface. CVD typically requires high temperature, in the order of 400 to 800° C. CVD at lower temperature tends to produce low quality films in terms of uniformity and impurities. To lower the deposition temperature, the precursors can be excited with a plasma energy in a plasma enhanced chemical vapor deposition (PECVD) process. The precursors and the process conditions of CVD processes are carefully chosen to avoid gas phase reaction, which leads to particle generation. The uniformity of CVD film is also a function of process conditions, and in general is not very good at very thin films.

Another deposition technology known as atomic layer deposition (ALD or ALCVD) has markable improvement over CVD technology in terms of gas phase reaction and thin film uniformity. In ALD, the precursor vapors are injected into the process chamber in alternating sequences: precursor, purge gas, reactant, purge gas with the precursor adsorbing onto the substrate and then subsequently reacting with the reactant. There are various modifications of the ALD processes, but the basic ALD processes all contain two distinct properties: alternating injection of precursors and the saturation of the precursor adsorption.

In ALD process, a precursor is delivered into the chamber and adsorbed onto the substrate surface. The adsorption temperature is lower than the reaction temperature of CVD process and the adsorbed amount is somewhat less sensitive to the wafer surface temperature. Then the precursor is shut off and a purge gas is delivered into the chamber to purge all the remaining precursor in the chamber volume. A reactant is then delivered into the chamber to react with the adsorbed precursor to form the desired film. Then another purge gas is delivered into the chamber to purge all the remaining reactant vapor in the chamber volume. By alternating precursors and reactants in the vapor stream, the possibility of gas phase reaction is minimized, allowing a wide range of possible precursors not usable with CVD technology. Also because of the adsorption mechanism, the deposited film is extremely uniform because once the surface is saturated, the additional precursors and reactants will not further adsorb or react and will just be exhausted away.

The precursor requirements of ALD are different from those of CVD because of the different deposition mechanisms. ALD precursors must have a self-limiting effect so that only a monolayer of precursor is adsorbed on the substrate. Because of this self-limiting effect, only one monolayer or a sub-monolayer is deposited per cycle, and additional precursor will not be deposited on the grown layer even when excess precursor or additional time is supplied. The precursors designed for ALD must readily adsorb at bonding sites on the deposited surface in a self-limiting mode. Once adsorbed, the precursors must react with the reactants to form the desired film. In CVD, the precursors and the reactants arrive at the substrate together and the film is deposited continuously from the reaction of the precursors with the reactants. The deposition rate in CVD process is proportional to the precursor and reactant flow rate and to the substrate temperature. In CVD the precursor and the reactant must react at the deposited surface simultaneously to form the desired film.

Thus many useful CVD precursors are not viable as ALD precursors and vice versa. It is not trivial or obvious to select a precursor for the ALD method.

Nitrate ($NO_3$) ligand is a powerful oxidizing and nitriding agent, and capable of reacting strongly with many compounds. Gates et al., U.S. Pat. No. 6,203,613, "*Atomic layer deposition with nitrate containing precursors*", discloses an ALD method specifically using metal nitrate precursors in conjunction with oxidizing, nitriding and reducing co-reactants to deposit oxide, nitride and metal films, respectively.

Similar to Gates et al., published works also show the ALD deposition of zirconium oxide using zirconium nitrate precursor together with an oxidizing agent such as water, or methanol, and the ALD deposition of hafnium oxide using hafnium nitrate precursor together with an oxidizing agent such as water, or methanol. For example, see Ono et al., in U.S. Pat. No. 6,420,279, "*Method of using atomic layer deposition to deposit a high dielectric constant material on a substrate*", the content being incorporated herein by reference. However; our research has shown that hafnium oxide deposited via hafnium nitrate together with an oxidizing agent has a dielectric constant lower than expected, probably due to the oxygen-rich nature of the hafnium oxide film.

It is advantageous to reduce the oxygen content of hafnium oxide to improve the quality of the hafnium oxide film.

It is advantageous to use hafnium nitrate on hydrogen-terminated silicon surface for a smooth uniform initiation of a hafnium oxide layer.

It is advantageous to form nanolaminates to modify the film characteristics by changes in composition.

It is advantageous to incorporate aluminum oxide to hafnium oxide for possible modification of the composite film properties such as better interface quality, and lower leakage current.

It is advantageous to incorporate aluminum impurities to increase the crystallization temperature of metal oxide.

SUMMARY OF THE INVENTION

A method for using a first metal nitrate-containing precursor as an oxidizing agent for a second metal-containing precursor during the formation of a metal oxide nanolaminate film is provided.

One object of the present invention is to provide an atomic layer deposition process using a nitrate-containing precursor as an oxidizing agent for another precursor to deposit an oxide nanolaminate film.

Another object of the present invention is to provide an atomic layer deposition process using a metal nitrate-containing precursor as an oxidizing agent for another metal-containing precursor to deposit a metal oxide nanolaminate film.

Another object of the present invention is to provide an atomic layer deposition process using a hafnium nitrate-containing precursor as an oxidizing agent for an aluminum-containing precursor to deposit a hafnium oxide/aluminum oxide nanolaminate film.

Another object of the present invention is to provide an atomic layer deposition process using a hafnium nitrate precursor as an oxidizing agent for an aluminum-containing precursor to deposit a hafnium oxide/aluminum oxide nanolaminate film that is useful as a gate dielectric or a capacitor dielectric in semiconductor applications.

ALD is an appropriate method to deposit nanolaminate films due to the sequential nature of the deposition technique. Conventional ALD method for metal oxide nanolaminate deposition requires four separate precursor deliveries (together with appropriate purging steps) of introducing a first metal precursor, then an oxidizer to provide a first metal oxide, then a second metal precursor, and then another oxidizer to provide a second metal oxide. The first metal oxide and the second metal oxide together form a metal oxide nanolaminate film.

The present invention provides an ALD method for metal oxide nanolaminate deposition requiring only two separate precursor deliveries (together with appropriate purging steps) of introducing a first metal nitrate-containing precursor, and then a second metal-containing precursor. The metal nitrate-containing precursor acts as an oxidizing agent for the second metal to form the metal oxides of the nanolaminate film.

By eliminating the oxidizer steps, the present invention significantly simplifies the deposition method. The process time and the system delivery complexity are almost cut in half.

Furthermore, the elimination of separate oxidizing steps allows better control of the metal oxide compositions and therefore improves the quality of the nanolaminate films. The extra oxidizing steps of the prior art process can make the metal oxide to be oxygen-rich because of the abundance of oxygen, especially in conjunction with a nitrate precursor.

The present invention describes the use of metal nitrate-containing precursors to act as an oxidizer for another metal-containing precursor in any ALD process to deposit metal oxides nanolaminates. The metals in the present invention can be any metal materials such as the elements from group IB (Cu), group IIB (Zn), group IIIB (Y), group IVB (Ti, Zr, Hf), group VB (V, Nb, Ta), group VIB (Cr, Mo, W), group VIIB (Mn), group VIIIB (Co, Ni), group IIIA (Al, Ga, In), group IVA (Ge, Sn), or the rare earth group (La, Ce, Nd, Sm, Gd). The term nanolaminate is broadly defined in the present invention to cover thin layers of different materials or thin layers of the same material. In certain aspects of the invention, the metal from the metal nitrate-containing precursor and the metal from the metal-containing precursor are different metals. Thus, the nanolaminate film comprises numerous thin layers of different materials: the oxide of a metal from the metal nitrate-containing precursor and the oxide of a different metal from the metal-containing precursor. In certain aspects of the invention, the metal from the metal nitrate-containing precursor and the metal from the metal-containing precursor are the same metals. Thus, the nanolaminate film comprises numerous thin layers of the same metal oxide material. These thin layers of the same metal oxide material are distinguishable only at the deposition time, e.g., one thin layer is deposited per deposition cycle, and are not distinguishable after deposition, e.g., one thin layer is not distinguishable from another thin layer after the deposition is completed.

A typical metal nitrate has the formula $M(NO_3)_x$, where M is the metal material, and x is the valency of M. For example, if M is hafnium with a valency of 4, the hafnium nitrate formula is $Hf(NO_3)_4$.

The main objective of the present invention is the use of metal nitrate-containing precursor to act as an oxidizer to control the oxygen amount introduced into the process chamber and to simplify the process flow. Therefore it is within the scope of the present invention to only retain at least one nitrate ($NO_3$) ligand in the metal nitrate-containing precursors. Some, but not all, of the $NO_3$ ligands can be replaced with a substituent R without affecting the effectiveness of the method. The reduction of $NO_3$ ligands in the metal nitrate-containing precursors can also offer a control mechanism to control the oxygen amount introduced into the process chamber to adjust the property of the resulting nanolaminate films. The substituted precursors can offer tailored properties of the precursors such as volatility, and thermal stability.

The substituent R can be numerous ligands, such as hydrogen, hydrocarbons, such as methyl ($CH_3$); and ethyl ($C_2H_5$), oxygen, oxynitrates, such as $NO_2$ and $N_2O_5$, hydroxyl, aromatics, amines, alkyls, silyl, alkoxides, diketones, or any mixtures thereof.

The second metal-containing precursor can contain oxygen or not contain oxygen. The selection of another oxygen-containing precursor can lead to more incorporation of oxygen while the choice of non oxygen-containing precursor can reduce the amount of oxygen. The metal-containing precursor can be any of the following: metal alkyls, metal halides, metal diketonates, metal alkoxides, metal hydrides, metal silyls, metal amides, metal acetylacetonates, metal t-butoxides, metal ethoxides and mixtures and combinations thereof.

The above ALD deposition sequence of first precursor/purge/second precursor/purge can be repeated until a desired thickness is reached. The last sequence can be a full sequence of first precursor/purge/second precursor/purge, or only a half sequence of first precursor/purge. The selection of the last sequence can modify somewhat the top surface of the deposited film.

In a preferred embodiment, the first metal is hafnium or zirconium metal. The present invention provides a method of atomic layer deposition of hafnium oxide/metal oxide nanolaminates using hafnium nitrate-containing precursor as an oxidizing agent for a metal-containing precursor. The method comprises the steps of providing a hafnium nitrate-containing precursor, then purging the hafnium nitrate precursor, then providing a metal-containing precursor and then purging the metal-containing precursor. The alternating precursor introduction creates a reaction between the hafnium nitrate and the metal-containing precursors to form nanolaminates of hafnium oxide and metal oxide.

In another preferred embodiment, the first metal is hafnium or zirconium metal, and the second metal is aluminum. The present invention provides a method of atomic layer deposition of hafnium oxide/aluminum oxide nanolaminates using hafnium nitrate-containing precursor as an oxidizing agent for an aluminum-containing precursor. The method comprises the steps of providing a hafnium nitrate-containing precursor, then purging the hafnium nitrate precursor, then providing an aluminum-containing precursor and then purging the aluminum-containing precursor. The alternating precursor introduction creates a reaction between the hafnium nitrate and the aluminum precursors to form nanolaminates of hafnium oxide and aluminum oxide.

In another preferred embodiment of depositing a hafnium oxide/aluminum oxide nanolaminate thin film for semiconductor applications, the present invention's first step is to provide a hydrogen-terminated silicon surface before exposing to the hafnium nitrate precursor. The combination of hafnium nitrate precursor and a hydrogen-terminated silicon surface can result in the initiation of the deposition of hafnium oxide directly on the hydrogen-terminated silicon surface without the need for an incubation period or the need for a thin silicon dioxide interfacial layer. The substrate is then exposed to a sequence of hafnium nitrate pulse, followed by a chamber purge, and then an aluminum-containing precursor, followed by another chamber purge. The sequence is repeated until the desired thickness is reached with the last step being either an aluminum-containing precursor pulse/chamber purge or a hafnium nitrate pulse/chamber purge. The fabrication process then proceeds with a post deposition anneal and the deposition of a gate electrode material.

The hafnium nitrate precursor can be an anhydrous hafnium nitrate to minimize the water content. The aluminum-containing precursor can be an aluminum halide such as aluminum chloride, or aluminum iodide. The aluminum-containing precursor can be an oregano metallic precursor such as trimethyl aluminum or triethyl aluminum precursor.

The deposition of the hafnium oxide/aluminum oxide nanolaminate thin film can comprise a further step of heating the substrate to a temperature below 200° C., preferably between 150° C. and 200° C., and specifically 170° C.

The chamber purging step can be done with any inert gas such as argon, or any inactive gas such as nitrogen.

DETAILED DESCRIPTION OF THE INVENTION

Figure 1:
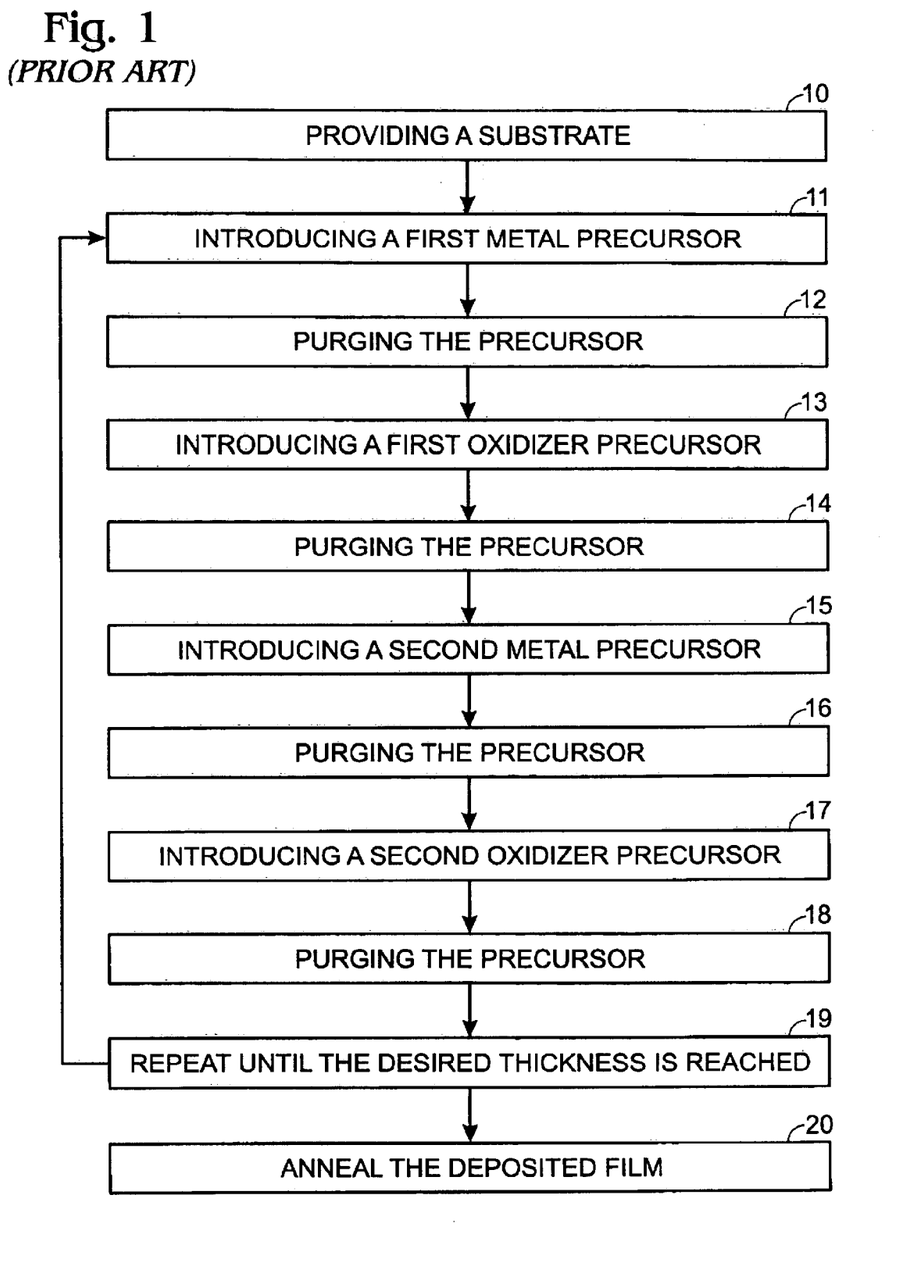
FIG. 1 is a flow chart of a prior art process for depositing a nanolaminate film.

FIG. 1 shows a flowchart of a prior art process showing the steps of depositing an oxide nanolaminate thin film. Step 10 provides a substrate within a process chamber. The substrate and the chamber are conditioned for the deposition process such as the growing of an oxide interface layer (step 10a). Steps 11 to 14 provide the first metal oxide of the two-oxide nanolaminate thin film. Step 11 provides a first metal precursor for an adsorption of the precursor onto the substrate such as hafnium chloride ($HfCl_4$). Step 12 provides a purging step to remove the precursor from the process chamber with an inactive gas such as nitrogen. Step 13 provides a first oxidizer such as water, alcohol, oxygen, or ozone to the process chamber. The oxidizer reacts with the adsorbed first metal precursor to form a first metal oxide such as hafnium oxide. Step 14 provides a purging step with nitrogen to remove the oxidizer and any by-products. Then the second metal oxide of the two-oxide nanolaminate thin film is provided in the steps 15 to 18. Step 15 provides a second metal precursor for an adsorption or reaction of the precursor onto the previously deposited substrate surface such as aluminum chloride ($AlCl_3$). Step 16 provides a purging step with nitrogen to remove the precursor from the process chamber. Step 17 provides a second oxidizer such as water, alcohol, oxygen, or ozone to the process chamber. The oxidizer reacts with the adsorbed second metal precursor to form a second metal oxide such as aluminum oxide. Step 18 provides a purging step with nitrogen to remove the oxidizer and any by-products. Steps 11 to 18 are repeated until the desired thickness is reached in step 19, and then the nanolaminate film is subjected to an optional anneal step 20 to improve the film quality such as film densification.

Figure 2:
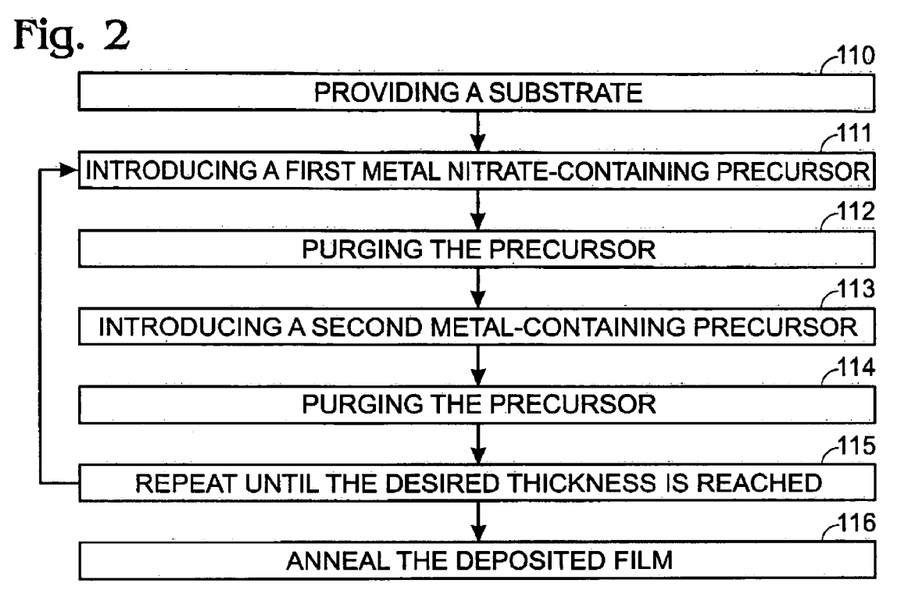
FIG. 2 is a flow chart of a process for depositing a nanolaminate film using a nitrate precursor as an oxidizing agent.

FIG. 2 is a flowchart showing the current invention steps of depositing an oxide nanolaminate thin film using a nitrate-containing precursor as an oxidizing agent for the second precursor. Step 110 provides a substrate within a process chamber. The substrate has undergone appropriate preparation prior to starting the deposition. The deposition normally occurs at low pressure, typically at 1 Torr pressure, so the chamber needs to be pumped down to the base pressure, about milliTorr range to reduce possible contamination. The substrate temperature needs to be prepared for the adsorption of the first precursor. Typical temperature for optimum adsorption is between 150 to 200° C. To prevent deposition on the chamber wall, the chamber wall setting is much lower than the substrate temperature. To prevent condensation of the precursor, the chamber wall also needs to be at about the same temperature as the precursor vapor, typically between 50° C. and 100° C. An appropriate temperature for the hafnium nitrate precursor is about 88° C. There are no special settings for the chamber. Since this process uses atomic layer deposition technique, meaning a sequence of precursor pulses, the chamber volume is desirably small to accelerate the saturation of precursor in the chamber volume, and the quick purging of the precursor.

The precursors also need to be prepared. The deposition technique uses the chemical vapor of the precursors delivered sequentially into the process chamber. Therefore the precursors need to be maintained at appropriate temperature to have a good vapor pressure to deliver to the process chamber. For gaseous precursors, meaning precursors that are in the gaseous state at room temperature, room temperature is adequate. For liquid precursors, meaning the precursors that are liquid at room temperature, the precursor temperature setting depends on the equilibrium vapor pressure of the liquid precursors. High volatile liquid precursors such as alcohol and acetone have a high equilibrium vapor pressure, so a low temperature setting at about room temperature is adequate to maintain a good vapor pressure. For low volatile liquid precursors, a high temperature setting is needed. The higher the temperature is, the higher the vapor pressure is, and as a consequence, the precursor delivery is easier. However, the temperature needs to be set lower than a maximum temperature where, the precursors can be damaged such as by thermal decomposition.

After the preparation of the process chamber and the substrate, the next step 111 is the introduction of a first metal nitrate-containing precursor. This precursor contains a number of nitrate ligands $NO_3$ bonding with the first metal. Depending on the valency of the first metal, the number of nitrate ligands can vary from 1 nitrate ligand to the maximum number of ligands to fill the valency of the metal. For example, the valency of hafnium is 4. Therefore, the hafnium nitrate-containing precursor can contain from 1 to 4 nitrate ligands. The basic concept of the present invention is the use of nitrate ligands to act as an oxidizer, therefore only one nitrate ligand is essential. The actual number of nitrate ligands in the precursor can be used as a control factor to optimize the amount of oxygen incorporated in the nanolaminate thin film.

After an appropriate time to allow the complete adsorption of the first metal nitrate-containing precursor onto the substrate, the precursor will be purged from the process chamber. The adsorption characteristic is self-limiting, therefore the precursor cannot adsorb more than one monolayer on the substrate surface, with typically only a submonolayer is adsorbed. The typical time for this step is from a few seconds to a few minutes, depending on the chamber design, the chamber volume, and the complexity of the substrate topology. In chamber:design using a showerhead delivery, the travel distance of the precursor is short and fairly uniform for all areas of the substrate, so the process of complete adsorption time of the precursor onto the substrate is short. In contrast, if the precursor is designed to deliver from one end and exhaust from the other end of the process chamber, the precursor depletion effect can lengthen the adsorption time. Similarly, a small chamber volume can offer shorter adsorption time because of faster chamber saturation. The substrate topology can also effect the adsorption time. In structures having deep trenches, precursor depletion effect and precursor delivery effect can lengthen the adsorption time.

After the first metal nitrate-containing precursor is adsorbed on the substrate, the precursor is turned off and then is purged from the process chamber to prepare for the introduction of the second precursor in step 112. The purging can be accomplished by a pumping step to evacuate the existing precursor in the process chamber. The characteristic of the pumping step is the reduction in chamber pressure to evacuate all gases. The purging can also be accomplished by a replacement step by using a non reacting gas such as nitrogen or inert gas to push all the precursor out of the process chamber. The characteristic of the replacement step is the maintaining of chamber pressure, with the precursor turned off and the purge gas turned on. A combination of these two steps can be used in the purging step, meaning a pumping step followed by a nitrogen or argon replacement step.

The longer the purging time is, the more complete the removal of the precursor is, but with a drop in throughput. Economic reason dictates the shortest purging time, therefore the optimum purging time is such that the presence of precursor residue does not affect the overall process, and is not dictated by the complete removal of the precursor.

After the chamber is free from the nitrate-containing precursor, the second metal-containing precursor is introduced into the process chamber in step 118. The adsorbed materials, either the first metal oxide or the nitrate ligands from the first precursor or both, will react with the second metal in the second precursor to form both first metal oxide and second metal oxide in a two-oxide nanolaminate thin film structure. As shown in FIG. 1, prior art conventional process of oxide nanolaminate thin film uses an oxidizer, such as water, oxygen, alcohol, or ozone, to form the metal oxides, therefore requires eight separate pulses of precursor/purge/oxidizer/purge/precursor/purge/oxidizer/purge, instead of only four pulses as in this invention: oxidizer-capable precursor/purge/precursor/purge.

After the nanolaminate formation, the second precursor is purged from the process chamber in step 114. Again, the purging step can be a pumping step, or a replacement step, or a combination of both a pumping and a replacement steps.

The above four steps 111, 112, 113 and 114 can be repeated until a desired thickness is reached in step 115. The resulting nanolaminate thin film can then be annealed at higher temperature, such as between 400° C. to 1000° C., to improve the film quality in step 116.

Figure 3:
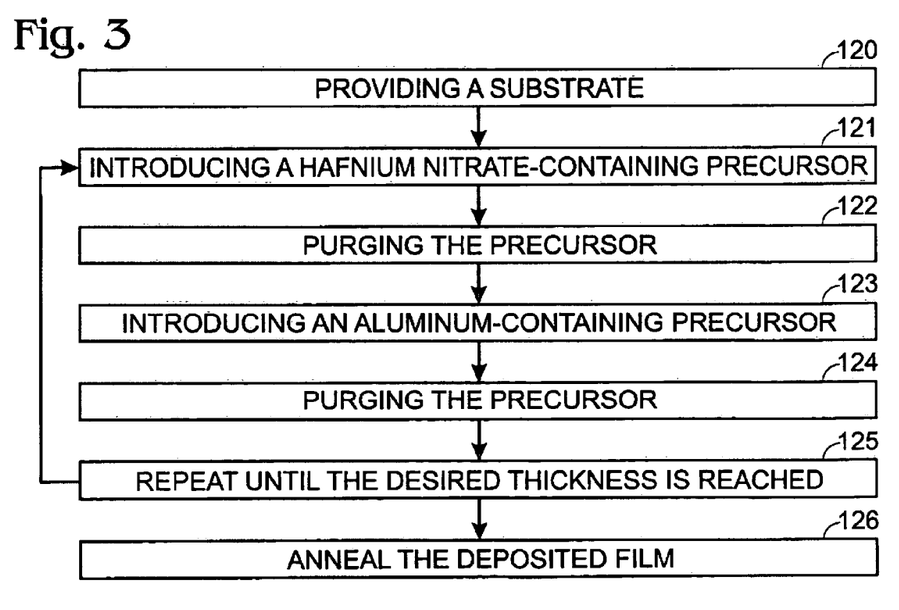
FIG. 3 is a flow chart of a process for depositing a nanolaminate film using hafnium nitrate precursor as an oxidizing agent.

FIG. 3 is a flow chart of a process for depositing a nanolaminate film using hafnium nitrate precursor as an oxidizing agent. Step 120 provides a substrate within a process chamber. The substrate and the chamber are prepared appropriately for the atomic Layer deposition process. The next step 121 is the introduction of a hafnium nitrate precursor, $Hf(NO_3)_4$, containing four nitrate ligands. After the hafnium nitrate precursor is adsorbed on the substrate, the precursor is turned off and then is purged from the process chamber in step 122. Hafnium nitrate can form hafnium oxide under appropriate conditions. Then, a metal-containing precursor is introduced into the process chamber in step 123. The reaction of the metal in the metal-containing precursor with the adsorbed materials will generate a hafnium oxide/metal oxide nanolaminate thin film structure.

The metal-containing precursors are selected to have a reaction with hafnium nitrate. A typical metal-containing precursor is aluminum halides such as aluminum chloride or aluminum iodide. Other possible aluminum precursors are organo metallic precursors such as trimethyl aluminum, or triethyl aluminum.

After the formation of the hafnium oxide/metal oxide nanolaminate, the metal-containing precursor is purged from the process chamber in step 124. The above four steps 121, 122, 123 and 124 can be repeated until a desired thickness is reached in step 125. The resulting hafnium oxide/metal oxide nanolaminate thin film can then be annealed at higher temperature, such as between 400° C. to 1000° C., to improve the film quality in step 126.

Figure 4:
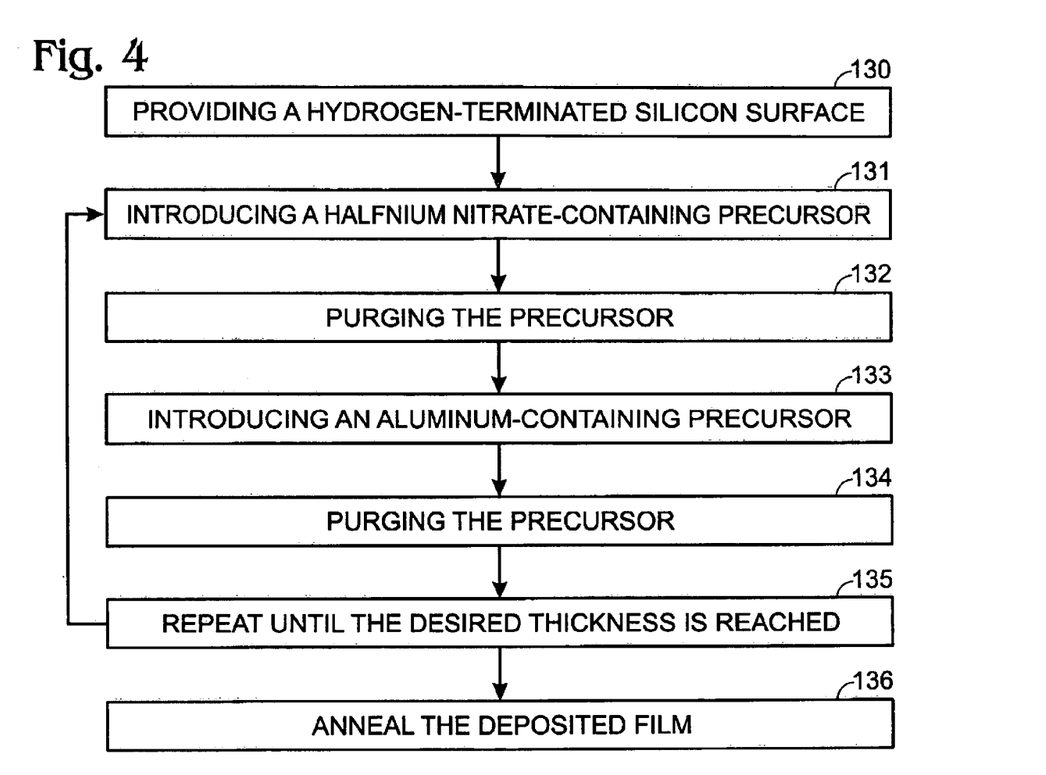
FIG. 4 is a flow chart of a process for depositing a hafnium oxide/aluminum oxide nanolaminate film for use in a semiconductor process using hafnium nitrate precursor and an aluminum precursor.

FIG. 4 is a flow chart of a process for depositing a hafnium oxide/aluminum oxide nanolaminate film for use in a semiconductor process using hafnium nitrate precursor and an aluminum precursor. Step 130 provides a hydrogen-terminated silicon surface on a semiconductor substrate within an atomic layer deposition process chamber.

The semiconductor substrate has undergone all circuit fabrication processes up to the need for a high k dielectric film. In the case of a high k capacitor dielectric, the substrate is prepared to have the bottom electrode ready. In the case of a high k gate dielectric, the substrate is ready to receive the gate dielectric. The preparation may include the formation of device isolation structure and a gate patterning step if a metal gate process is used. Then the semiconductor substrate is prepared to have a hydrogen-terminated silicon surface. The hydrogen-terminated silicon surface is a result from many standard industry semiconductor cleaning processes. These standard cleaning processes are typically a quick immersion of the silicon wafers into an HF solution to remove any native oxide of the silicon surface and to produce a silicon surface that is hydrogen terminated. The hydrogen-terminated silicon surface is essential to remove all trace amount of native silicon oxide that could lower the k value of the high k dielectric. Experiments have shown that a combination of hafnium nitrate precursor and a hydrogen-terminated silicon surface can result in the initiation of the deposition of hafnium oxide directly on the hydrogen-terminated silicon surface without the need for an incubation period or the need for a thin silicon dioxide interfacial layer.

After the substrate and the chamber have been prepared appropriately for the atomic layer deposition process, the next step 131 is the introduction of a hafnium nitrate precursor, $Hf(NO_3)_4$. After the hafnium nitrate precursor is adsorbed on the substrate, the precursor is turned off and then is purged from the process chamber in step 132. Then an aluminum-containing precursor is introduced into the process chamber in step 133. The reaction of the aluminum in the aluminum-containing precursor with the adsorbed materials will generate a hafnium oxide/aluminum oxide nanolaminate thin film, structure. After the formation of the hafnium oxide/aluminum oxide nanolaminate, the aluminum-containing precursor is purged from the process chamber in step 134. The above four steps 131, 132, 133 and 134 can be repeated until a desired thickness is reached in step 135. The resulting hafnium oxide/aluminum oxide nanolaminate thin film can then be annealed at higher temperature, such as between 400° C. to 1000° C., to improve the film quality in step 136.

Figure 5A:
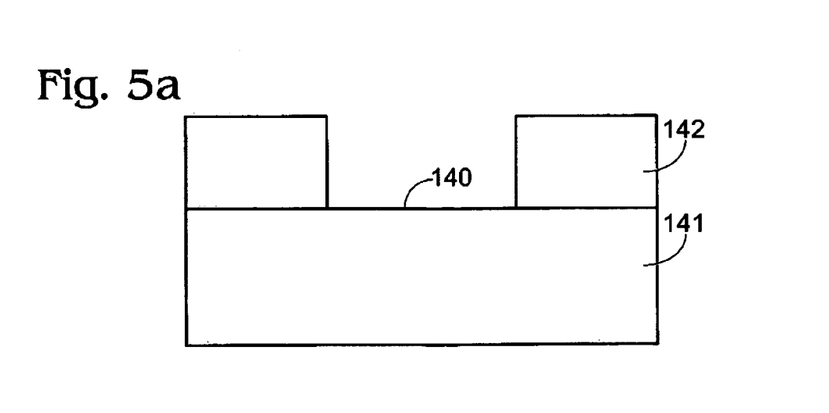
FIGS. 5a–5d show the steps in the deposition process of a hafnium oxide/aluminum oxide nanolaminate thin film for semiconductor gate dielectric application.

FIGS. 5a–5d show the steps in the deposition process of a hafnium oxide/aluminum oxide nanolaminate thin film for a semiconductor gate dielectric application. FIG. 5a shows a partially processed integrated circuit (IC) device structure prior to the deposition of a gate dielectric. The structure shown can be formed by any fabrication method. The structure shown in FIG. 5a is for a replacement gate process, includes a silicon substrate 141, a field oxide 142 defining the gate stack pattern, and a hydrogen-terminated silicon surface 140. The last step before the deposition of the high k gate dielectric is the exposure of the silicon surface to HF to prepare a hydrogen-terminated surface. The exposure to HF can be an immersion into a liquid HF tank, or an exposure to an HF vapor. HF will etch all the native silicon oxide and leave a hydrogen-terminated silicon surface.

Figure 5B:
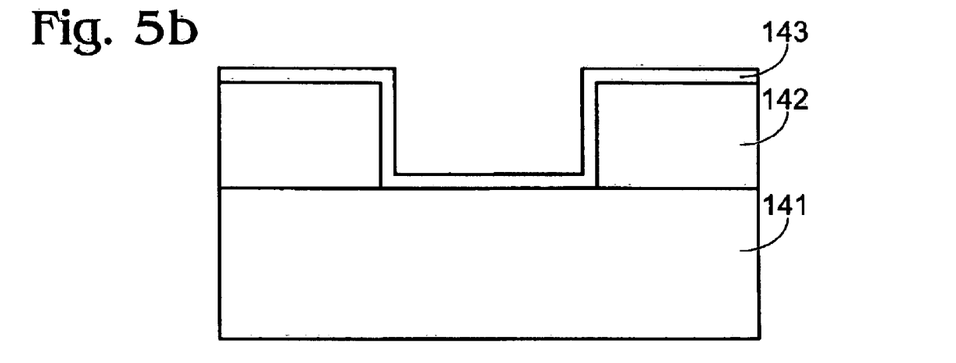

FIG. 5b shows the IC device structure after a pulse of hafnium nitrate $Hf(NO_3)_4$ precursor. The hafnium nitrate pulse initiates a deposition of hafnium oxide directly on the hydrogen-terminated surface without the need for an incubation period or a thin silicon oxide interfacial layer. This figure shows only a schematic representation of a hafnium oxide layer 143. The actual hafnium oxide layer may or may not be continuous throughout the whole surface. Also the nitrate ligands may or may not present on the hafnium oxide layer.

Figure 5C:
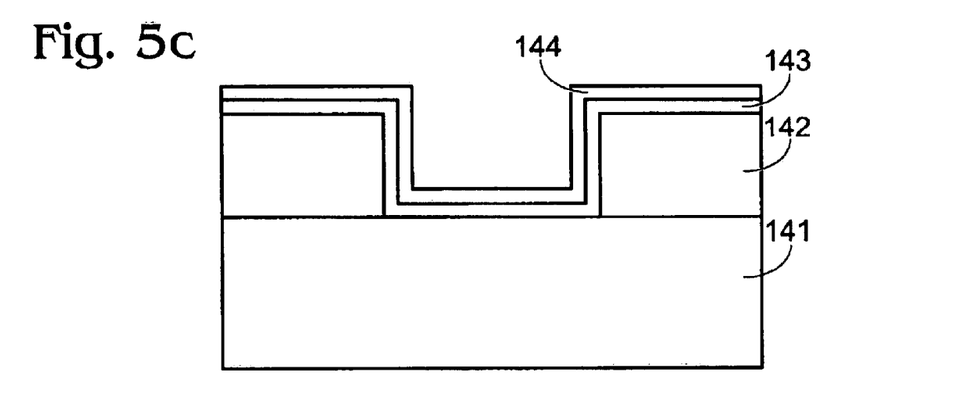
Figure 5D:
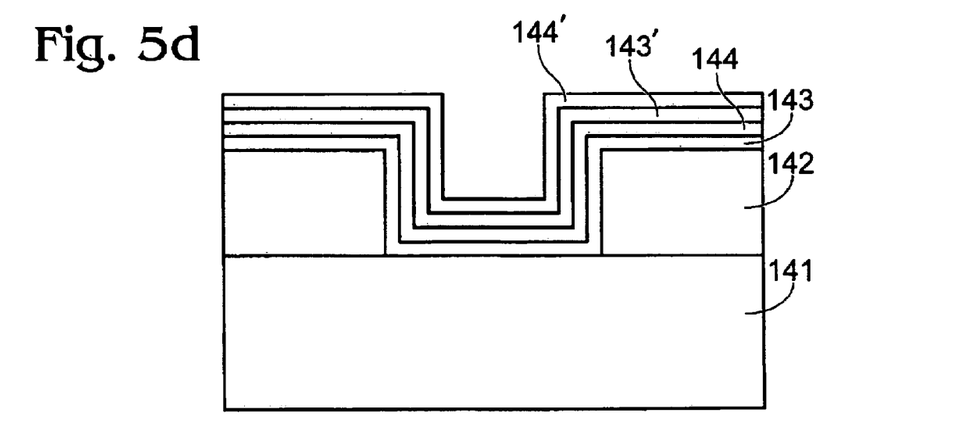

FIG. 5c shows the IC device structure after a nitrogen purge to clean the process chamber of the hafnium nitrate and after a pulse of aluminum chloride $AlCl_3$ precursor. A layer of aluminum oxide 144 is formed after the aluminum chloride pulse. The purpose of the aluminum chloride precursor is to create a hafnium oxide/aluminum oxide nanolaminate film. FIG. 5d shows the IC device structure after another layer 143' of hafnium oxide deposited via another pulse of hafnium nitrate and another layer 144' of aluminum oxide deposited via another pulse of aluminum chloride. The sequence is repeated until the nanolaminate film reaches the desired thickness. The fabrication process then proceeds with a post deposition anneal and the deposition of a gate material such as a gate metal. This process is then followed by a chemical mechanical polishing (CMP) step to pattern the gate stack structure.

A hafnium oxide/aluminum oxide nanolaminate thin film was deposited with 10 $Hf(NO_3)_4/AlCl_3$ cycles following the process described in FIGS. 5. The post deposition anneal conditions were 850° C. anneal in nitrogen for 60 seconds. The film was visually uniform after the deposition as well as after the post deposition anneal step. Spectroscopic ellipsometry measurement shows a post anneal thickness of 4 nm, indicating a 0.4 nm/cycle growth. Another hafnium oxide/aluminum oxide nanolaminate film deposited via 20 cycles and anneal was found to be about 15.2 nm thick, corresponding to a 0.76 nm/cycle growth. This deposition rate range is approximately 3 to 5 times higher than that previously reported for either $Hf(NO_3)_4/H_2O$ or $Al(CH_3)_3/H_2O$ depositions.

Figure 6:
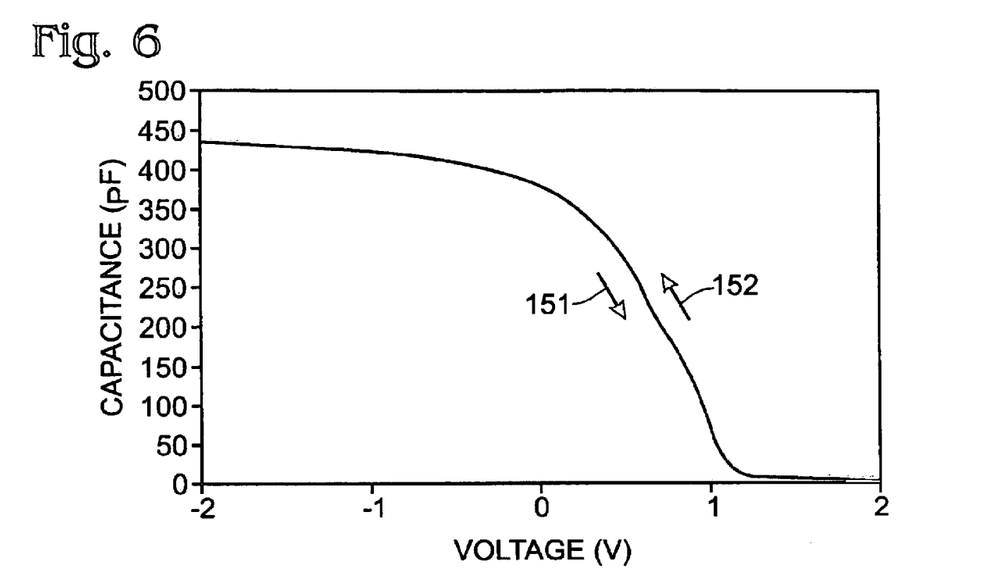
FIG. 6 shows a plot of capacitance vs. bias voltage for a 4 nm hafnium oxide/aluminum oxide nanolaminate thin film deposited using the present invention method.

FIG. 6 shows a plot of capacitance vs. bias voltage for a 4 nm hafnium oxide/aluminum oxide nanolaminate thin film deposited using the present invention method. The capacitors were formed by sputtering platinum (Pt) dots through a shadow mask. The threshold voltage is shifted due to the work function of platinum metal gate. Accounting for the Pt work function, a capacitive equivalent thickness (CET) of 2.6 nm is extracted from $C_{max}$ (at the bias voltage of –1.2V). This CET indicates that the effective dielectric constant for the nanolaminate film is about 5.9. This dielectric constant is about 50% higher than that of silicon dioxide. A hafnium oxide film of similar physical thickness deposited via ALD of $Hf(NO_3)_4/H_2O$ would have an effective dielectric constant in the range of about 10. The dielectric constant of hafnium oxide/aluminum oxide nanolaminate film is expected to be lower because the bulk dielectric constant of aluminum oxide (9) is lower than that of hafnium oxide (25). The slight distortion of the CV curve in FIG. 6 is an indication of interface trapping and could be eliminated with process optimization. The CV curve shows low hysteresis effect, as evidence by the almost identical curves following the forward 151 and reverse 152 directions of the bias voltage. This low hysteresis indicates the high quality of the nanolaminate film and suggests low charge trapping.

Figure 7:
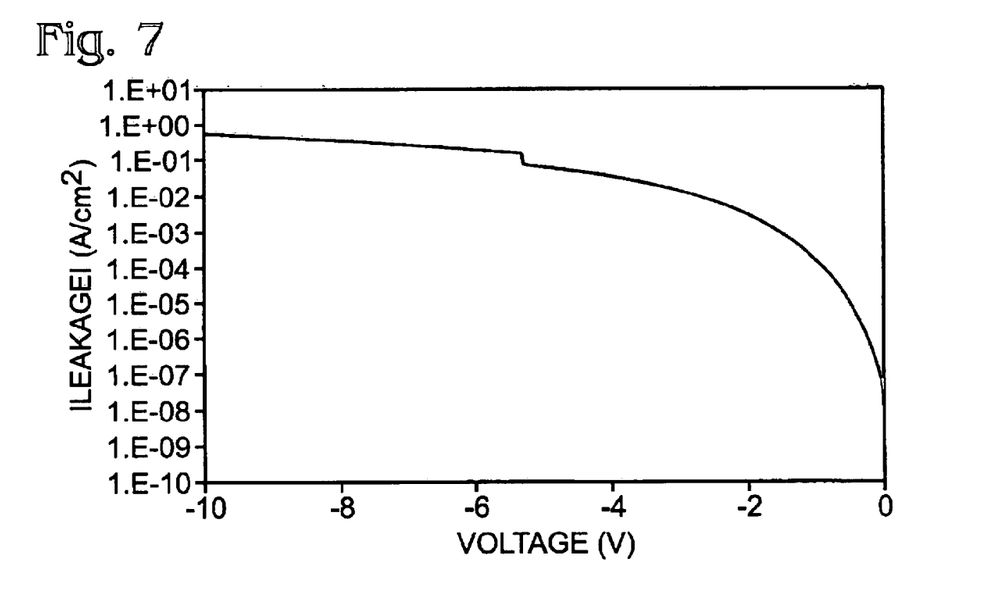
FIG. 7 shows a plot of leakage current vs. bias voltage for the same 4 nm hafnium oxide/aluminum oxide nanolaminate thin film.

FIG. 7 shows a plot of leakage current vs. bias voltage for the same 4 nm film shown in FIG. 6. Although the leakage current is approximately 3 orders of magnitude greater than an $HfO_2$ of similar CET, it is still more than 2 orders of magnitude less than silicon dioxide of similar CET. The 4 nm film shows a voltage breakdown at about 5V.

What is claimed is:

1. A method for using a first metal nitrate-containing precursor as an oxidizing agent for a second metal-containing precursor in an atomic layer deposition process for the formation of an oxide nanolaminate film, the method comprising the steps of:

a. introducing a first metal nitrate-containing precursor;
   b. forming a first metal nitrate;
   c. purging the first metal nitrate-containing precursor;
   d. introducing a second metal-containing precursor;
   e. oxidizing the second metal-containing precursor in response to the first metal nitrate; and
   f. purging the second metal-containing precursor.

2. The method of claim 1, wherein the metals are selected from a group consisting of Cu, Zn, Y, Ti, Zr, Hf, V, Nb, Ta, Cr, Mo, W, Mn, Co, Ni, Al, Ga, In, Ge, Sn, La, Ce, Nd, Sm, Gd.

3. The method of claim 1, wherein some, but not all, of the nitrate ligands of the first metal nitrate-containing precursor are replaced with a substituent R, the substituent R being selected from a group consisting of hydrogen, oxygen, oxynitrates, hydroxyl, aromatic, amine, alkyl, silyl, alkoxide, diketone, and mixtures thereof.

4. The method of claim 1, wherein the second metal-containing precursor is a non oxygen containing precursor.

5. The method of claim 1, wherein the second metal-containing precursor is selected from a group consisting of metal alkyls, metal halides, metal diketonates, metal alkoxides, metal hydrides, metal silyls, metal amides, metal acetylacetonates, metal t-butoxides, metal ethoxides and mixtures and combinations thereof.

6. A method for using a hafnium nitrate-containing precursor as an oxidizing agent for a metal-containing precursor in an atomic layer deposition process for the formation of a hafnium oxide/metal oxide nanolaminate film, the method comprising the steps of:

a. introducing a hafnium nitrate-containing precursor;
   b. forming a hafnium nitrate film;
   c. purging the hafnium nitrate-containing precursor;
   d. introducing a metal-containing precursor;
   e. oxidizing the metal-containing precursor in response to the hafnium nitrate film; and
   f. purging the metal-containing precursor.

7. The method of claim 6, wherein some, but not all, of the nitrate ligands of the hafnium nitrate-containing precursor are replaced with a substituent R, the substituent R being selected from a group consisting of hydrogen, oxygen, oxynitrates, hydroxyl, aromatic, amine, alkyl, silyl, alkoxide, diketone, and mixtures thereof.

8. The method of claim 6, wherein the metal-containing precursor is a non oxygen containing precursor.

9. The method of claim 6, wherein the metal-containing precursor is selected from a group consisting of metal alkyls, metal halides, metal diketonates, metal alkoxides, metal hydrides, metal silyls, metal amides, metal acetylacetonates, metal t-butoxides, metal ethoxides and mixtures and combinations thereof.

* * * * *